United States Patent
Toyoda et al.

(10) Patent No.: US 9,882,101 B2
(45) Date of Patent: Jan. 30, 2018

(54) METHOD OF MANUFACTURING LIGHT EMITTING DEVICE

(71) Applicant: TOYODA GOSEI CO., LTD., Kiyosu-shi (JP)

(72) Inventors: Yusuke Toyoda, Kiyosu (JP); Takumi Narita, Kiyosu (JP); Masanori Ogawa, Kiyosu (JP); Motoyuki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/446,954

(22) Filed: Mar. 1, 2017

(65) Prior Publication Data
US 2017/0279014 A1    Sep. 28, 2017

(30) Foreign Application Priority Data
Mar. 22, 2016    (JP) .................. 2016-057609

(51) Int. Cl.
*H01L 33/50*    (2010.01)
*H01L 33/62*    (2010.01)

(52) U.S. Cl.
CPC .......... *H01L 33/505* (2013.01); *H01L 33/504* (2013.01); *H01L 33/62* (2013.01); *H01L 2933/0041* (2013.01); *H01L 2933/0066* (2013.01)

(58) Field of Classification Search
CPC ....... H01L 33/50; H01L 33/52; H01L 33/505; H01L 33/62; H01L 33/504; H01L 33/0041
See application file for complete search history.

(56) References Cited

U.S. PATENT DOCUMENTS

| 2011/0079816 A1* | 4/2011 | Fujioka ................. H01L 23/295 257/100 |
| 2012/0052608 A1* | 3/2012 | Yoo ........................ H01L 33/505 438/27 |
| 2013/0193837 A1 | 8/2013 | Ohno et al. |
| 2017/0069801 A1* | 3/2017 | Oka ........................ H01L 33/486 |

FOREIGN PATENT DOCUMENTS

| JP | 2005-024272 A | 1/2005 |
| JP | 2013-153105 A | 8/2013 |

* cited by examiner

*Primary Examiner* — Dung Le
(74) *Attorney, Agent, or Firm* — McGinn IP Law Group, PLLC

(57) ABSTRACT

A method of manufacturing a light emitting device includes injecting liquid or pasty transparent resin into a sheet forming mold, adding a phosphor to the resin in the mold, centrifugally rotating the mold so as to settle the phosphor included in the resin toward one surface side of the resin, thermally curing the resin so as to form a phosphor sheet, the phosphor sheet including a phosphor layer formed on the one surface side of the resin and a transparent layer formed on an other surface side of the resin, overlaying the phosphor sheet on a light emitting element such that the phosphor layer of the phosphor sheet contacts with a light emitting surface of the light emitting element, mounting the light emitting element with the phosphor sheet overlaid on a board, and flattening a surface of the transparent layer of the phosphor sheet on the light emitting element.

6 Claims, 5 Drawing Sheets

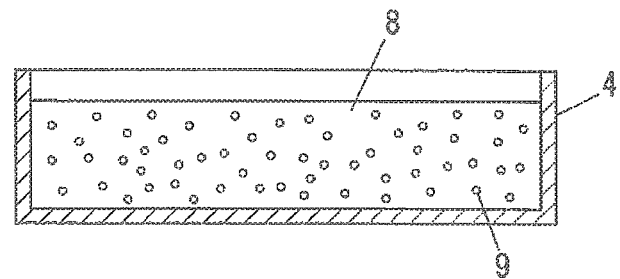
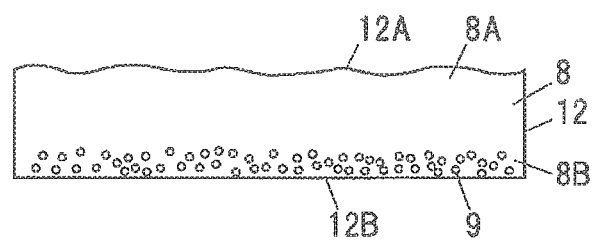
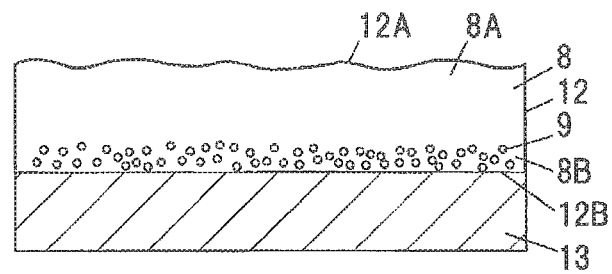
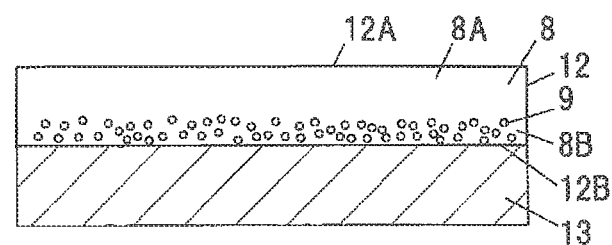
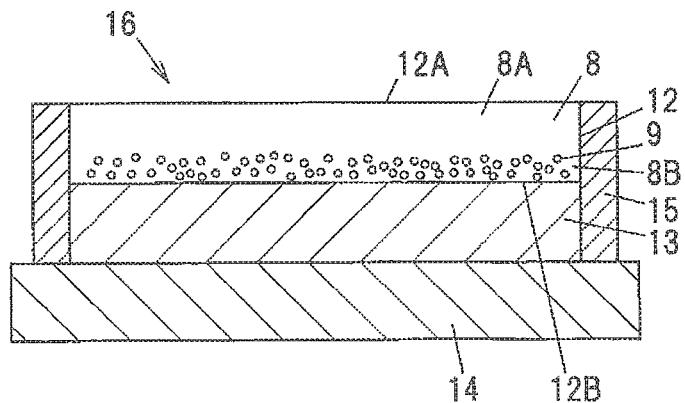

METHOD OF MANUFACTURING LIGHT EMITTING DEVICE

The present application is based on Japanese patent application No. 2016-057609 filed on Mar. 22, 2016, the entire contents of which are incorporated herein by reference.

BACKGROUND OF THE INVENTION

1. Field of the Invention

The invention relates to a method of manufacturing a light emitting device using a phosphor sheet.

2. Description of the Related Art

A light emitting device is known in which the phosphor sheet obtained by processing a phosphor containing resin into a sheet is disposed on a light emitting surface of a light emitting element such as a light emitting diode (LED) chip is known. In the light emitting device, a color of a light emitted from the light emitting element and transmitted through the phosphor sheet is mixed with a color of a light emitted from the phosphor in the phosphor sheet so as to produce an emission color of the light emitting device.

In the above light emitting device, the phosphor is dispersed in a whole thickness direction of the phosphor sheet. Among lights emitted from the light emitting element and passing through the phosphor sheet, with regard to the amount of phosphor-wavelength converted light, light emitted in a direction inclined from immediately above the light emitting element is higher than light emitted immediately above the light emitting element. This is because the light emitted in the inclined direction has longer distance (i.e., optical path) needed for passing through the phosphor sheet than the light emitted immediately above the light emitting element. Thus, a problem on the dispersion of emission chromaticity may arise due to the difference of emission angle.

To solve the problem, for example, a light emitting device is known which controls the emission chromaticity dispersion caused by the emission angle difference by arranging a phosphor plate which is composed of a base, phosphor and a light scattering material on the light emitting element so as to diffuse the light emitted from the light emitting element by the light scattering material (see e.g. JP-A-2013-153105).

Also, a two layer structure phosphor sheet is known which is composed of a transparent layer and a high concentrate phosphor layer (see e.g. JP-A-2005-24272). According to the phosphor sheet, the phosphor layer is arranged contacting with or coming close to the light emitting surface of the light emitting element. Thereby, the distance of the light emitted from the light emitting element and passing through the phosphor layer can be nearly equalized at any emission angles so as to prevent the emission chromaticity dispersion caused by the emission angle difference.

SUMMARY OF THE INVENTION

The light emitting device disclosed in JP-A-2013-153105 is constructed such that the light scattering material is contained in the sealing resin. Therefore, the amount of light passing through the phosphor plate may be reduced so as to cause a reduction in brightness of the emission light. On the other hand, the phosphor sheet disclosed in JP-A-2005-24272 needs the transparent layer is manufactured separately from the phosphor layer. Therefore, the manufacturing cost may increase due to the complicated manufacturing process.

As a modification of the general sealing method in which the light emitting element is sealed with the sealing resin in which phosphor is mixed, it has been proposed that the phosphor in the sealing resin is settled close to the light emitting surface of the light emitting element by controlling the curing temperature of the sealing resin (see e.g., JP-A-2012-9905). However, in the proposed sealing method, it is difficult to provide an equalized curing temperature for the sealing resin which is formed into a thin sheet with a large area. Thus, the phosphor may be settled unevenly such that the phosphor density is dispersed.

It is an object to the invention to provide a method of manufacturing a light emitting device that prevents a reduction in brightness of the emission light and a dispersion in emission chromaticity due to the emission angle (or optical path) difference while reducing the manufacturing cost and the phosphor density dispersion.

According to an embodiment of the invention, provided is a method of manufacturing a light emitting element as defined by [1] to [5] below.

[1] A method of manufacturing a light emitting device, comprising:
  injecting liquid or pasty transparent resin into a sheet forming mold;
  adding a phosphor to the resin in the mold;
  centrifugally rotating the mold so as to settle the phosphor included in the resin toward one surface side of the resin;
  thermally curing the resin with the phosphor settled so as to form a phosphor sheet, the phosphor sheet comprising a phosphor layer formed on the one surface side of the resin and a transparent layer formed on an other surface side of the resin;
  overlaying the phosphor sheet on a light emitting element such that the phosphor layer of the phosphor sheet contacts with a light emitting surface of the light emitting element;
  mounting the light emitting element with the phosphor sheet overlaid on a board comprising a wiring layer; and
  flattening a surface of the transparent layer of the phosphor sheet on the light emitting element.

[2] The method according to [1], wherein the adding of the phosphor comprises adding a first phosphor having a predetermined emission wavelength and a predetermined specific gravity, and a second phosphor having an emission wavelength less than the predetermined wavelength and a specific gravity less than the predetermined specific gravity, and
  wherein the first and second phosphors are simultaneously added to the resin.

[3] The method according to [1], wherein the adding of the phosphor comprises adding a first phosphor having a predetermined emission wavelength and second phosphor having an emission wavelength less than the predetermined wavelength, and
  wherein the second phosphor is added to the resin after the first phosphor is added to the resin.

[4] The method according to [1], wherein the phosphor comprises a phosphor particle that emits a yellowish light, and
  wherein the light emitting element emits a bluish light.

[5] The method according to [2] or [3], wherein the first phosphor comprises a phosphor that emits a reddish light,
  wherein the second phosphor comprises a phosphor that emits a greenish light, and
  wherein the light emitting element emits a bluish light.

Effects of the Invention

According to an embodiment of the invention, a method of manufacturing a light emitting device can be provided that prevents a reduction in brightness of the emission light and a dispersion in emission chromaticity due to the emission angle (optical path) difference while reducing the manufacturing cost and the phosphor density dispersion.

BRIEF DESCRIPTION OF THE DRAWINGS

Next, the present invention will be explained in conjunction with appended drawings, wherein:

FIG. 4A is a cross sectional view showing the method of manufacturing the light emitting device according to the first embodiment;

FIG. 4B is the cross sectional view showing the method of manufacturing the light emitting device according to the first embodiment;

FIG. 4C is a cross sectional view showing the method of manufacturing the light emitting device according to the first embodiment;

FIG. 4D is a cross sectional view showing the method of manufacturing the light emitting device according to the first embodiment;

FIG. 4E is a cross sectional view showing the method of manufacturing the light emitting device according to the first embodiment;

DETAILED DESCRIPTION OF THE PREFERRED EMBODIMENTS

First Embodiment

Figure 1:
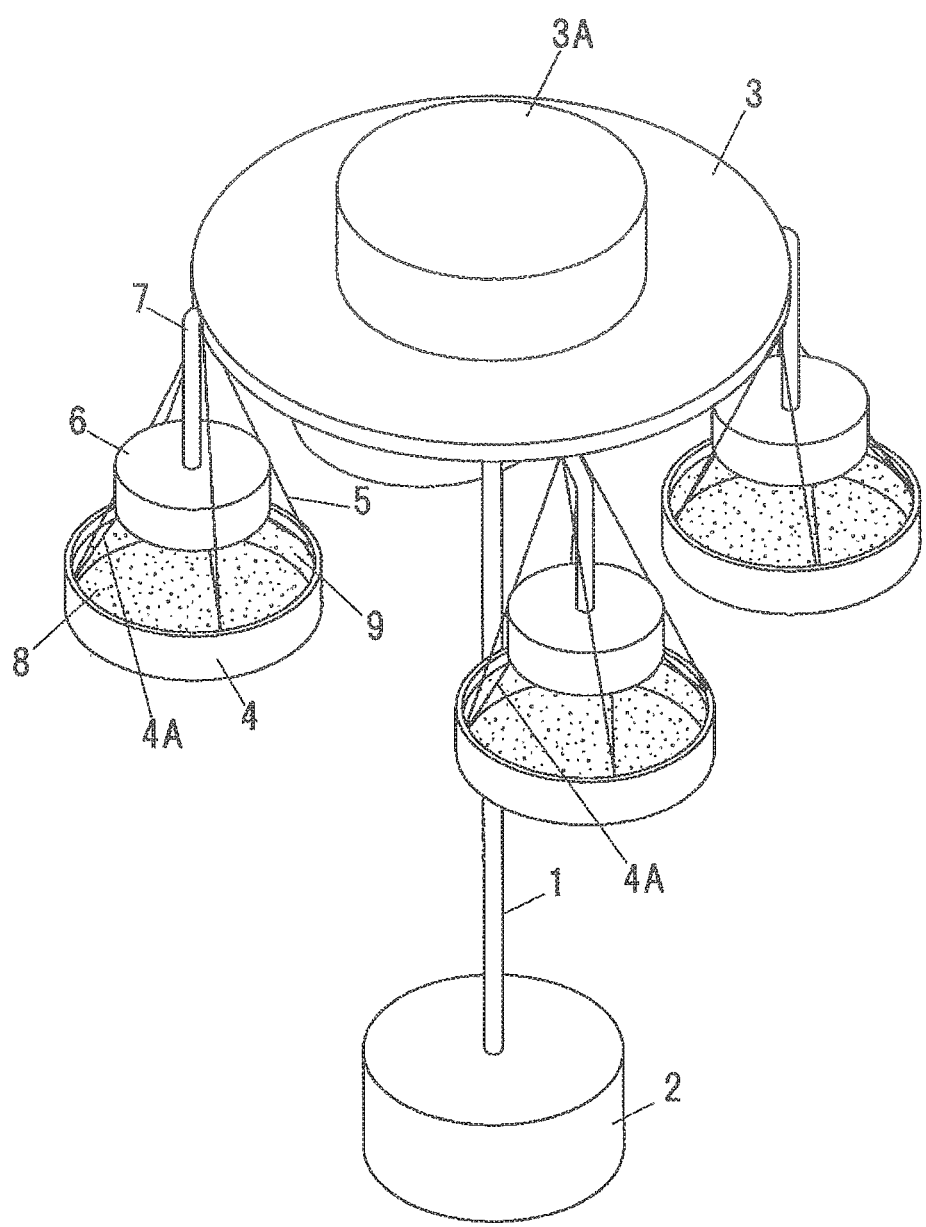
FIG. 1 is a schematic drawing of a phosphor settling device according to the first embodiment.

FIG. 1 is a schematic drawing of a phosphor settling device used in a method of manufacturing a light emitting device according to the first embodiment. The phosphor settling device is provided with a drive part 2 which rotates a rotational axis 1, a rotating plate 3 which is fixed on the rotational axis 1, a mold 4 which is hanged on a periphery of the rotating plate 3 through wire 5, a phosphor supplier 6 (which is provided with a nozzle (not shown)) which is disposed above the mold 4, and a hose 7 to supply phosphor from a phosphor tank 3A on the rotating plate 3 to the phosphor supplier 6.

The rotating plate 3 is rotated by receiving driving force from the drive part 2 through the rotational axis 1 in a predetermined rotating frequency.

The mold 4 is connected with one end of plural wires 5 (three wires in the present embodiment) of which the other end are connected to a hanging member (not shown) of the rotating plate 3, and supported by the hanging member of the rotating plate 3 so as to swing freely. That is, the mold 4 is swung for substantial horizontal direction by receiving centrifugal force and rising from the vertical direction when the mold 4 is rotated by rotating the rotating plate 3.

Also, a transparent resin 8 having fluidity such as liquid or paste is injected into the mold 4, and the transparent resin 8 is held so as to be in the form of a sheet.

The phosphor supplier 6 is supported by a supporting member 4A such as metallic wire so as to set and remove freely. And the phosphor supplier 6 jets evenly, for example, a yellow phosphor (or yellowish phosphor) 9 which is supplied in the phosphor tank 3A on a whole surface of the transparent resin 8 from above the mold 4.

Figure 2:
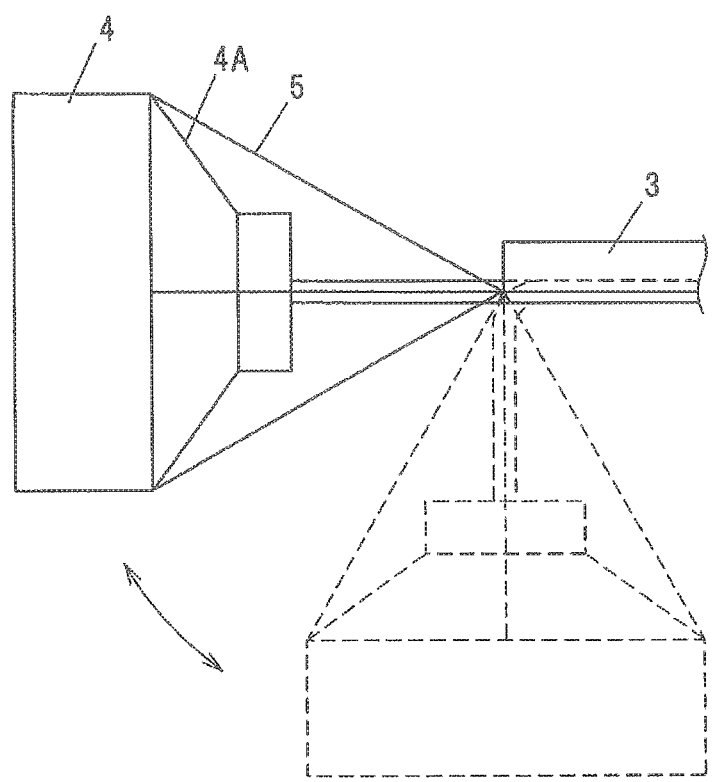
FIG. 2 is an explanation drawing showing a centrifugal state of a mold shown in FIG. 1.

FIG. 2 shows a state of the mold 4 in centrifugal rotating. When the rotating plate 3 stands, as shown by a dot-line shown in FIG. 2, the mold 4 is hanged in the vertical direction caused by the gravity. However, when the rotating plate 3 is rotated, the mold 4 swings toward the arrow direction by the centrifugal force, and rotates in the substantial horizontal direction by about 90° from the vertical direction. When the transparent resin 8 and the yellow phosphor 9 are injected into the mold 4 in stopping the rotating plate 3, and then the rotating plate 3 is rotated with the predetermined rotating frequency, the yellow phosphor 9 on the surface side of the transparent resin 8 can be settled toward a mold 4 bottom surface side.

Figure 3:
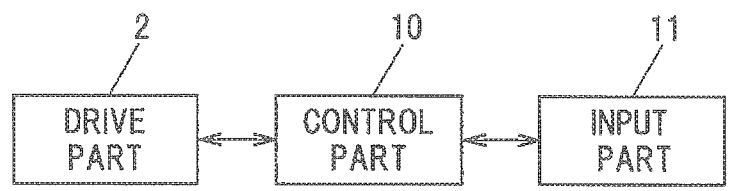
FIG. 3 is a block diagram showing the phosphor settling device.

FIG. 3 is a block diagram showing the phosphor settling device. As shown in FIG. 3, the phosphor settling device is provided with a control part 10 to output a driving signal for a drive part 2 which drives the rotational axis 1, and an input part 11 which outputs a control condition to the control part 10 by inputting the predetermined rotating frequency, and setting rotational time etc. The control part 10 monitors a driving state of the drive part 2 and controls the drive part 2 so as to keep the predetermined rotating frequency set previously.

Next, the method of manufacturing the light emitting device according to the first embodiment will be explained below.

(Phosphor Settling Process)

The transparent resin 8 having fluidity such as liquid or paste is injected into the mold 4 of the phosphor settling device shown in FIG. 1. In this case, for example, silicon resin or epoxy resin is used as the transparent resin 8.

Next, the yellow phosphor 9 is supplied from the phosphor tank 3A of the phosphor settling device to the phosphor supplier 6 through the hose 7, and is jet evenly on the whole surface of the transparent resin 8 from above the mold 4. For example, YAG phosphor ($Y_3Al_5O_{12}$:Ce) is used as the yellow phosphor 9.

After adding the yellow phosphor 9 into the transparent resin 8, the rotating plate 3 is rotated with the predetermined rotating frequency which is input from the input part 11.

When the rotating plate 3 begins to rotate, the mold 4 hanged in the vertical direction also rotates with the rotating plate 3. When the mold 4 rotates, the mold 4 swings gradually for the allow direction by the centrifugal force, and the mold 4 rotates in substantial horizontal direction while the position of the mold 4 keeps in rotating by 90° if the rotating frequency of the rotating plate 3 reaches the predetermined rotating frequency (for example, 1000 rpm) (a state shown by the full line in FIG. 2). And the phosphor supplier 6 supported by the supporting member 4A so as to set and remove freely follows the movement of the mold 4.

In this case, the yellow phosphor 9 on the surface side of the transparent resin 8 begins to settle toward the mold 4 bottom surface side. FIG. 4A shows settling the yellow phosphor 9. After the predetermined rotating time (for example, 5 minutes) which is input from the input part 11 passes, all yellow phosphor 9 is settled in the mold 4 bottom surface side of the transparent resin 8.

(Heating Process)

When the yellow phosphor 9 is settled in the mold 4 bottom surface side of the transparent resin 8, the mold 4 is released from the phosphor settling device, and the transparent resin 8 is cured, for example, under the condition at a temperature of 150° C. for 1 hour in a furnace (not shown). Hereby, the phosphor sheet 12 is obtained. Meanwhile, the transparent resin 8 may be heated immediately or heated while the transparent resin 8 is centrifugal separated after arranging a heating mechanism in the phosphor settling device shown in FIG. 1 and settling the phosphor. These manufacturing methods can reduce manufacturing cost.

FIG. 4B shows the phosphor sheet 12 which is the transparent resin 8 cured by the heating process released from the mold 4. The yellow phosphor 9 contained in the transparent resin 8 is dispersed evenly with high concentration in a bottom surface 12B side transparent resin 8 by settling for the bottom surface 12B side by the centrifugal force in the phosphor settling process, and the phosphor layer 8B is formed by the above method. Meanwhile, the yellow phosphor 9 is disappeared in the upper surface 12A side transparent resin 8, thus a transparent layer 8A is formed. By this way, a phosphor sheet 12 which is separated with the transparent layer 8A and the phosphor layer 8B is formed. After the phosphor sheet 12 is released from the mold 4, the phosphor sheet 12 is cut out so as to adjust the size of the light emitting surface of the light emitting element described below.

(Light Emitting Device Fabricating Process)

Next, as shown in FIG. 4C, a light emitting element 13 is prepared by the other method. And the phosphor sheet 12 is overlaid on the light emitting element 13 such that the bottom surface 12B of the phosphor sheet 12 obtained by the heating process contacts on the light emitting surface of the light emitting element 13

The light emitting element is provided with a board and a crystal layer containing a light emitting layer (not shown each other). The light emitting element is a flip-chip light emitting element of which an electrode (not shown) faces bottom (an opposite side of the phosphor sheet 12 side). For example, the light emitting element is an LED chip or a laser diode chip and emits blue light (or bluish light) from the phosphor sheet 12 side surface as the light emitting surface.

Next, as shown in FIG. 4D, the upper surface 12A side of the phosphor sheet 12 is removed with a predetermined thickness and the upper surface 12A is smoothed such that the thickness of the phosphor sheet 12 is even.

After smoothing the upper surface 12A of the phosphor sheet 12, as shown in FIG. 4E, the light emitting element 13 is mounted on the board 14 by connecting a wiring pattern of the board 14 obtained by the other process with the electrode of the light emitting element 13 through a conductive bump. The board 14 is, for example, a wiring board having the wiring pattern on the surface or is a lead frame inserted board.

Finally, a circular wall portion 15 is formed on the board 14 so as to surround the light emitting element 13 and the phosphor sheet 12. And thus, the light emitting device 16 is manufactured. The wall portion 15 is made of resin such as silicon resin containing white paint such as Titanium oxide.

For the light emitting device 16 manufactured by the above method, when the blue light is emitted from the light emitting element 13, the yellow light is emitted from the yellow phosphor 9 by exciting the yellow phosphor 9 by part of the blue light in the phosphor layer 8B which is formed evenly with high concentration at the bottom surface 12B side of the phosphor sheet 12. Thus, a white light which is the mixed light of a blue light emitted from the light emitting element 13 through the upper surface 12A of the phosphor sheet 12 and the yellow light emitted from the yellow phosphor 9 is emitted. In this case, since the distance of the blue light emitted from the light emitting element and passing through the phosphor layer 8B is nearly equal even by either emission angle, the proportion of wavelength conversion substantially has no difference and emission chromaticity dispersion caused by the emission angle difference can be controlled.

Second Embodiment

FIGS. 5A to 5F are explanation diagrams showing a light emitting device according to the second embodiment. A method of manufacturing the light emitting device according to the present embodiment is different in using a red phosphor (or reddish phosphor) and a green phosphor (or greenish phosphor) instead of the yellow phosphor used in the first embodiment. Since the heating process and the fabricating process of the light emitting device are followed by the first embodiment, a phosphor settling process will be mainly explained below.

First, the transparent resin 8 having fluidity such as liquid or paste is injected into the mold 4 of the phosphor settling device shown in FIG. 1, and then the red phosphor 9 is supplied from the phosphor tank 3A of the phosphor settling device to the phosphor supplier 6 through the hose 7, and is jet evenly on the whole surface of the transparent resin 8 from above the mold 4. For example, KSF phosphor ($K_2SiF_6$:Mn) is used as the red phosphor 17.

Figure 5A:
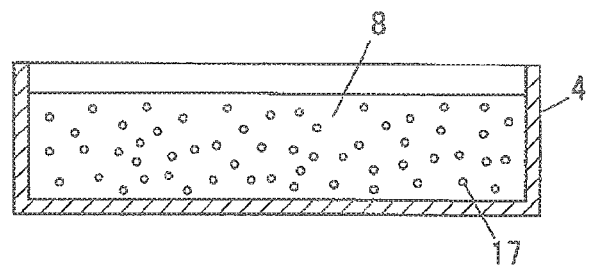
FIG. 5A is a cross sectional view showing the method of manufacturing the light emitting device according to the second embodiment.

Next, the rotating plate 3 is rotated with the predetermined rotating frequency which is input from the input part 11. When the rotating plate 3 is rotated, as shown in FIG. 5A, the red phosphor 17 on the surface side of the transparent resin 8 begins to settle toward the mold 4 bottom surface side. After the predetermined rotating time which is input from the input part 11 passes, all red phosphor 17 is settled in the mold 4 bottom surface side of the transparent resin 8.

Next, the rotating plate 3 stops rotating, and then the green phosphor 18 is supplied from the phosphor tank 3A for the green phosphor which is changed with the phosphor tank 3A for the red phosphor to the phosphor supplier 6 through the hose 7, and the green phosphor 18 is jet evenly on the whole surface of the transparent resin 8 from above the mold 4. For example, β SiAlON phosphor (($Si, Al)_6(O, N)_8$:Eu) is used as the green phosphor 18.

Figure 5B:
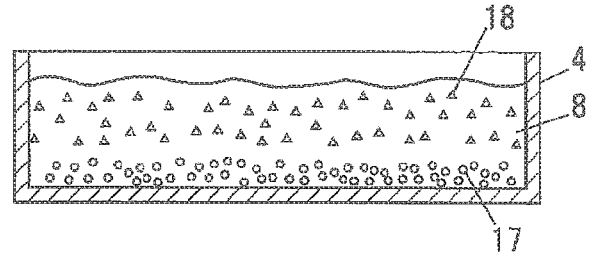
FIG. 5B is the cross sectional view showing the method of manufacturing the light emitting device according to the second embodiment.
Figure 5C:
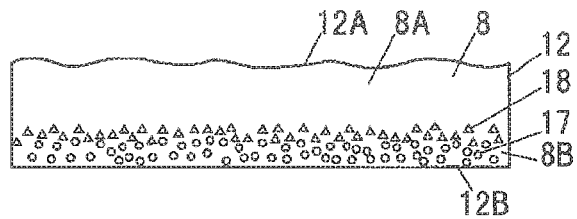
FIG. 5C is a cross sectional view showing the method of manufacturing the light emitting device according to the second embodiment.
Figure 5D:
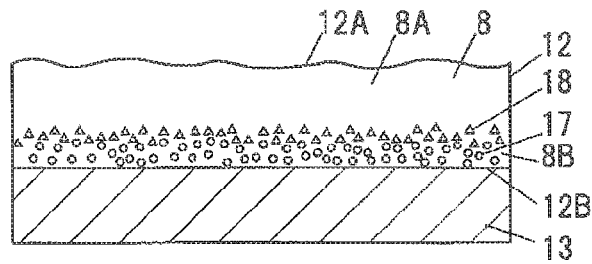
FIG. 5D is a cross sectional view showing the method of manufacturing the light emitting device according to the second embodiment.
Figure 5E:
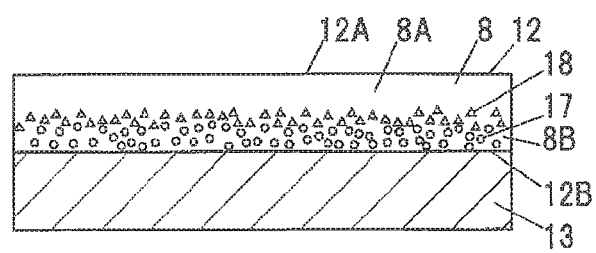
FIG. 5E is a cross sectional view showing the method of manufacturing the light emitting device according to the second embodiment.
Figure 5F:
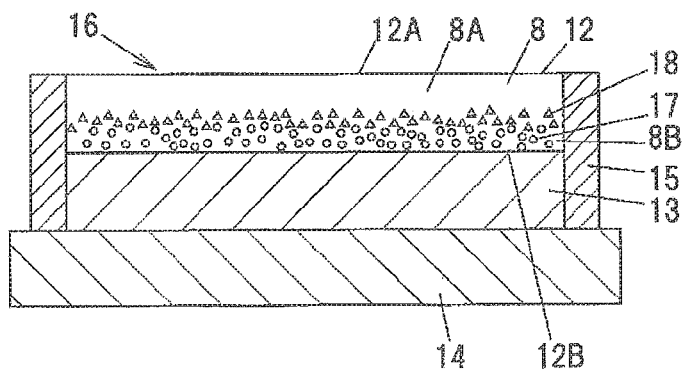
FIG. 5F is a cross sectional view showing the method of manufacturing the light emitting device according to the second embodiment.

Next, the rotating plate 3 is rotated with the predetermined rotating frequency which is input from the input part 11. When the rotating plate 3 is rotated, as shown in FIG. 5B, the green phosphor 18 on the surface side of the transparent resin 8 begins to settle toward the mold 4 bottom surface side. After the predetermined rotating time which is input from the input part 11 passes, all green phosphor 18 is settled on the settled red phosphor 17 of the transparent resin 8.

After the phosphor settling process is finished, as with the first embodiment, the heating process and the fabricating process of the light emitting device are carried out (as shown in FIGS. 5C to 5F), the light emitting device 16 is manufactured.

For the light emitting device 16 manufactured by the above method, when the blue light is emitted from the light emitting element 13, the red light is emitted from the red phosphor 17 by exciting the red phosphor 17 by part of the blue light in the phosphor layer 8B which is formed evenly with high concentration at the bottom surface 12B side of the phosphor sheet 12, and the green light is emitted from the green phosphor 18 by exciting the green phosphor 18 by part of the blue light. Thus, a white light which is the mixed light of the blue light emitted from the light emitting element 13 through the upper surface 12A of the phosphor sheet 12, the red light emitted from the red phosphor 17, and the green light emitted from the green phosphor 18 is emitted. In this case, since the distance of the blue light emitted from the light emitting element and passing through the phosphor layer 8B is nearly equal even by either emission angle, the proportion of wavelength conversion substantially has no difference and the emission chromaticity dispersion caused by the emission angle difference can be controlled.

Also, as with the present embodiment, when the red phosphor 17 whose emission wavelength is in long wavelength side and the green phosphor 18 whose emission wavelength is in short wavelength side are settled in the transparent resin 8, if the phosphor whose emission wavelength is in the long wavelength side is disposed nearer to the emitting surface side than the phosphor whose wavelength is in the short wavelength side, since the light emitted from the phosphor whose emission wavelength is in the short wavelength side excites the phosphor whose emission wavelength is in the long wavelength side, color balance becomes unbalance. Thus, it is preferable to settle the phosphor whose emission wavelength is in the short wavelength side after settling the phosphor whose emission wavelength is in the long wavelength side in the transparent resin 8.

Also, in the case that settles the phosphor whose emission wavelength is in the long wavelength side and the phosphor whose emission wavelength is in the short wavelength side in the transparent resin 8, if a specific gravity of the phosphor whose emission wavelength is in the short wavelength side is less than a specific gravity of the phosphor whose emission wavelength is in the long wavelength side, the phosphor whose emission wavelength is in the long wavelength side and the phosphor whose emission wavelength is in the short wavelength side may be settled at the same time. In this case, since the settling speed of the phosphor whose emission wavelength is in the long wavelength side is faster than the settling speed of phosphor whose emission wavelength is in the short wavelength side, the phosphor whose emission wavelength is in the short wavelength side is disposed on the phosphor whose emission wavelength is in the long wavelength side.

Meanwhile, in the first and second embodiments, although the phosphor settling device has a structure to rotate the mold hanged in the vertical direction. However, it is not limited thereto. The phosphor settling device may have the structure which can keep the transparent resin 8 in the form of a sheet and apply the centrifugal force in the sheet vertical direction by rotating such as a structure which rotates the mold disposed in an outer circumference surface of a drum or an inner circumference surface of a cylindrical drum.

Advantageous Effects of the Embodiments

According to the present embodiments, by centrifugal rotating the transparent resin 8 containing the phosphor and settling the phosphor in the transparent resin 8, since the transparent resin 8 has two layer structure having the transparent layer 8A and the phosphor layer 8B, and the phosphor sheet 12 is formed by thermal curing the two layer structure, the dispersion by the concentration of the phosphor layer 8B can be controlled and forming the transparent layer 8A by the other process is not necessary. Thus, the manufacturing cost can be reduced. Also, since the thin phosphor layer 8B is formed on the light emitting surface of the light emitting element 13, the distance of the light emitted from the light emitting element 13 and passing through the phosphor layer 8B is nearly equal even by either emission angle, the emission chromaticity dispersion caused by the emission angle difference can be controlled. Also, since it is not needed to contain a light scattering material in the phosphor layer 8B, the emission light fails to be dark.

Although the embodiments of the invention have been described, the invention is not to be limited to the embodiments. Further, the various kinds of modifications can be implemented without departing from the gist of the invention.

Although the embodiments of the invention have been described, the invention according to claims is not to be limited to the embodiments. Further, it should be noted that all combinations of the features described in the embodiments are not necessary to solve the problem of the invention.

What is claimed is:

1. A method of manufacturing a light emitting device, comprising:
    injecting liquid or pasty transparent resin into a sheet forming mold;
    adding a phosphor to the resin in the mold;
    centrifugally rotating the mold so as to settle the phosphor included in the resin toward one surface side of the resin;
    thermally curing the resin with the phosphor settled so as to form a phosphor sheet, the phosphor sheet comprising a phosphor layer formed on the one surface side of the resin and a transparent layer formed on an other surface side of the resin;
    overlaying the phosphor sheet on a light emitting element such that the phosphor layer of the phosphor sheet contacts with a light emitting surface of the light emitting element;
    mounting the light emitting element with the phosphor sheet overlaid on a board comprising a wiring layer; and
    flattening a surface of the transparent layer of the phosphor sheet on the light emitting element.

2. The method according to claim 1, wherein the adding of the phosphor comprises adding a first phosphor having a predetermined emission wavelength and a predetermined specific gravity, and a second phosphor having an emission wavelength less than the predetermined wavelength and a specific gravity less than the predetermined specific gravity, and
    wherein the first and second phosphors are simultaneously added to the resin.

3. The method according to claim 1, wherein the adding of the phosphor comprises adding a first phosphor having a predetermined emission wavelength and second phosphor having an emission wavelength less than the predetermined wavelength, and
   wherein the second phosphor is added to the resin after the first phosphor is added to the resin.

4. The method according to claim 1, wherein the phosphor comprises a phosphor particle that emits a yellowish light, and
   wherein the light emitting element emits a bluish light.

5. The method according claim 2, wherein the first phosphor comprises a phosphor that emits a reddish light,
   wherein the second phosphor comprises a phosphor that emits a greenish light, and
   wherein the light emitting element emits a bluish light.

6. The method according to claim 3, wherein the first phosphor comprises a phosphor that emits a reddish light,
   wherein the second phosphor comprises a phosphor that emits a greenish light, and
   wherein the light emitting element emits a bluish light.

\* \* \* \* \*